United States Patent
Jeng et al.

(10) Patent No.: US 9,297,863 B2
(45) Date of Patent: Mar. 29, 2016

(54) PLANARIZED THREE-DIMENSIONAL (3D) MAGNETIC SENSOR CHIP

(71) Applicant: Meng-Huang Lai, New Taipei (TW)

(72) Inventors: Jen-Tzong Jeng, New Taipei (TW); Fu-Te Yuan, New Taipei (TW); Meng-Huang Lai, New Taipei (TW)

(73) Assignee: Meng-Huang Lai, New Taipei (TW)

( * ) Notice: Subject to any disclaimer, the term of this patent is extended or adjusted under 35 U.S.C. 154(b) by 399 days.

(21) Appl. No.: 13/834,426

(22) Filed: Mar. 15, 2013

(65) Prior Publication Data

US 2014/0266184 A1    Sep. 18, 2014

(51) Int. Cl.
  *G01R 33/00* (2006.01)
  *G01R 33/02* (2006.01)
  *G01R 33/09* (2006.01)

(52) U.S. Cl.
  CPC ........ *G01R 33/0011* (2013.01); *G01R 33/0005* (2013.01)

(58) Field of Classification Search
  CPC ............... G01R 33/0206; G01R 33/09; G01R 33/0005; G01R 33/07; G01R 33/0011; G01R 33/093; G01R 33/077; G01R 15/202; G01R 33/0052; G01R 33/04
  USPC .......... 324/117 H, 207.2, 228, 251, 252, 331, 324/249
  See application file for complete search history.

(56) References Cited

U.S. PATENT DOCUMENTS

| | | | |
|---|---|---|---|
| 2007/0200564 A1* | 8/2007 | Motz et al. | 324/247 |
| 2009/0027048 A1* | 1/2009 | Sato et al. | 324/247 |
| 2012/0013332 A1* | 1/2012 | Honkura et al. | 324/244 |
| 2012/0217960 A1* | 8/2012 | Ausserlechner | 324/252 |
| 2013/0134969 A1* | 5/2013 | Ohta et al. | 324/252 |

* cited by examiner

*Primary Examiner* — Tung X Nguyen
*Assistant Examiner* — Neel Shah
(74) *Attorney, Agent, or Firm* — Lin & Associates Intellectual Property, Inc.

(57) ABSTRACT

A planarized 3-dimensional magnetic sensor chip includes a first magnetic sensing device, a second magnetic sensing device, a third magnetic sensing device and a magnetic flux bending concentrating structure on a circuit chip substrate, wherein the first magnetic sensing device and the second magnetic sensing device are used to measure the magnitude of flux in a first direction and a third direction together, and the third magnetic sensing device is used to measure the magnitude of flux in a second direction, the magnetic flux bending concentrating structure is used to bend the magnitude of flux in the third direction to the first direction, such that the magnitude of flux in the third direction can be measured by first magnetic sensing device and the second magnetic sensing device in the first direction.

12 Claims, 5 Drawing Sheets

PLANARIZED THREE-DIMENSIONAL (3D) MAGNETIC SENSOR CHIP

BACKGROUND OF THE INVENTION

1. Field of the Invention

The present invention relates to a three-dimensional (3D) magnetic sensor chip, especially to a sensor chip which can measure the magnetic flux magnitude in 3D on a plane using a magnetic flux bending concentrating structure.

2. The Prior Arts

Magnetic sensors have been widely used in various fields, and are mainly used to detect magnetic fields. For example, magnetic sensors are used in the magnetic sensors of the earth, linear sensors, and angular sensors and switch sensors to detect the magnetic field so as to perform direction positioning, navigation or measurement. As the technology advances, such as the vehicle navigation systems and smart phones, the need of magnetic sensors in the navigation field has also grown. With the characteristics of magnetic sensing, magnetic sensors can be quickly applied in the navigation and global positioning system. It is the trend of modern electronic design to combine devices with different function into a single electronic product, thus, as the size of the product grows smaller, the design of the magnetic sensors is also challenged.

A conventional magnetic sensor unit includes three magnetic sensing devices of the same structure, where the two magnetic sensing devices are disposed in the vertical direction of a plane to measure the magnitude of the magnetic flux in the X and Y axes. The other magnetic sensing device, which is used to measure the Z axis magnitude of the magnetic flux, is disposed vertically to the other two magnetic sensing devices. As the design of the integrated circuits grows smaller, the vertical connection between the magnetic sensing devices has to be done in two-stages. In addition, the vertical connection is hard to be standardized, thus the yield is low, failure is more likely to happen and the overall production cost is increased.

Therefore, manufacturers thereof are in an urgent to develop a sensor structure with a smaller size, in which the magnetic sensing devices of three directions thereof are placed on the same plane, to resolve the manufacturing problems mentioned above.

SUMMARY OF THE INVENTION

The primary purpose of the present invention is to provide a planarized 3D magnetic sensor chip, including a circuit chip substrate, a first magnetic sensing device, a second magnetic sensing device, a third magnetic sensing device and a magnetic bending concentrating structure. The first, second and third magnetic sensing devices and the magnetic bending concentrating structure are disposed on the top surface of the circuit chip substrate, and are electrically connected with a circuit in the circuit chip substrate. The second magnetic sensing device cooperatively measures the magnitude of a magnetic flux in a first direction and a third direction with the first magnetic sensing device. The third magnetic sensing device measures the magnitude of the magnetic flux in a second direction, where the second direction is vertical to the first direction with respect to a plane, and the third direction is vertical to the first and second direction.

The magnetic bending concentrating structure is disposed between the first and second magnetic sensors, so as to concentrate and bend the magnetic flux in the third direction to the first direction. In this way, the magnetic flux magnitude in the third direction can be measured by the first and second magnetic sensing device in the first direction.

Furthermore, a set of fourth magnetic sensing device and fifth magnetic sensing device can be utilized to replace the third magnetic sensing device. The magnetic flux bending concentrating structure is disposed between the first and second magnetic sensing device, and/or is disposed between the fourth and fifth magnetic sensing device. The magnetic flux bending concentrating structure concentrates and bends the magnetic flux in the third direction to the first direction, so the magnetic flux magnitude in the third direction can be measured by the first and second magnetic sensing device in the first direction, or the magnetic flux magnitude in the third direction can be measured by the fourth and fifth magnetic sensing device in the second direction.

The magnetic bending concentrating structure can be manufactured with the first, second and third magnetic sensing device (or with the fourth and fifth magnetic sensing device) by the semiconductor manufacture method. Alternatively, the magnetic bending concentrating structure can be prepared beforehand and then cut and placed at intended positions. The magnetic bending concentrating structure can also be formed via physical or chemical deposition and etching, or can also be implemented with embedded structure. By bending the magnetic flux, the magnetic flux magnitudes in three dimensions can be measured on a plane, instead of the conventional method where a 2-steps manufacturing method is needed to install a magnetic sensing device in a third direction. In this way, the yield and production rate of the magnetic sensor can be greatly improved.

DETAILED DESCRIPTION OF THE PREFERRED EMBODIMENTS

The present invention will be apparent to those skilled in the art by reading the following detailed description of preferred embodiments thereof, with reference to the attached drawings.

Figure 1A:
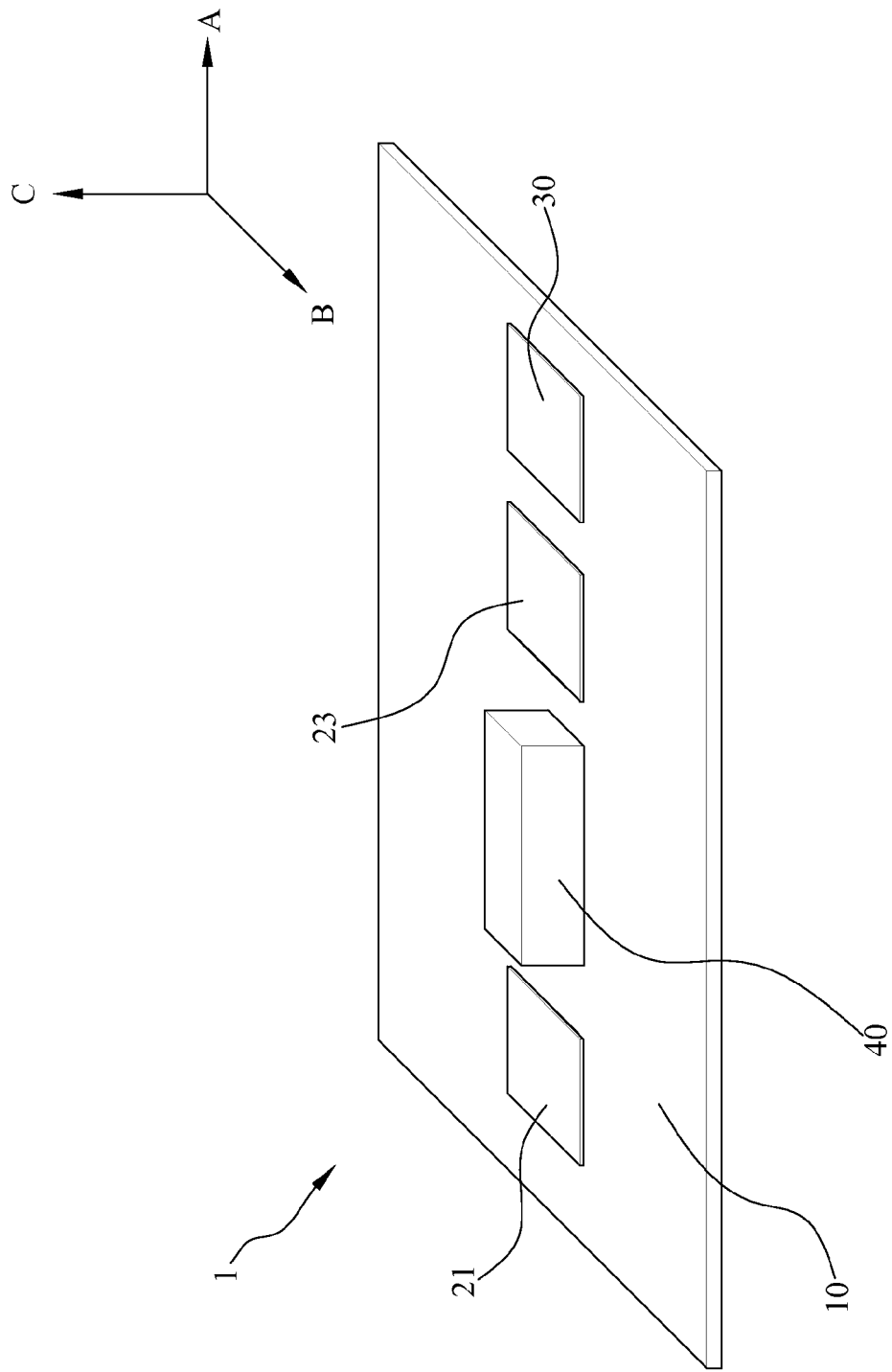
FIG. 1A is a perspective view showing the first embodiment of a planarized 3D magnetic sensor chip of the present invention.

FIG. 1A is a perspective view showing the first embodiment of a planarized 3D magnetic sensor chip of the present invention. As shown in FIG. 1A, the planarized three-dimensional (3D) sensor chip 1 according to the first embodiment includes a circuit chip substrate 10, a first magnetic sensing device 21, a second magnetic sensing device 23, a third magnetic sensing device 31 and a magnetic flux bending concentrating structure 40. The first magnetic sensing device 21, the second magnetic sensing device 23, the third magnetic sensing device 30 and the magnetic bending concentrating structure 40 are disposed on a top surface of the circuit chip substrate 10, and are electrically connected with a circuit (not shown) in the circuit chip substrate 10. The first magnetic sensing device 21 and the second magnetic sensing device 23 cooperatively measure the magnitude of a magnetic flux in a first direction A. The third magnetic sensing device 30 measures the magnitude of the magnetic flux in a second direction B, where the second direction B is vertical to the first direction A with respect to a plane. The magnetic bending concentrating structure 40 is disposed between the first magnetic sensing device 21 and the second magnetic sensing device 23 in such manner that the first magnetic sensing device 21 and the second magnetic sensing device 23 are symmetric about the magnetic bending concentrating structure 40. In this way, the magnetic flux magnitude in a third direction C is bended to the first direction A, so the magnetic flux magnitude in the third direction can be measured by the first magnetic sensing device 21 and the second magnetic sensing device 23. Herein, the third direction C is vertical to both the first direction A and the second direction B.

Figure 1B:
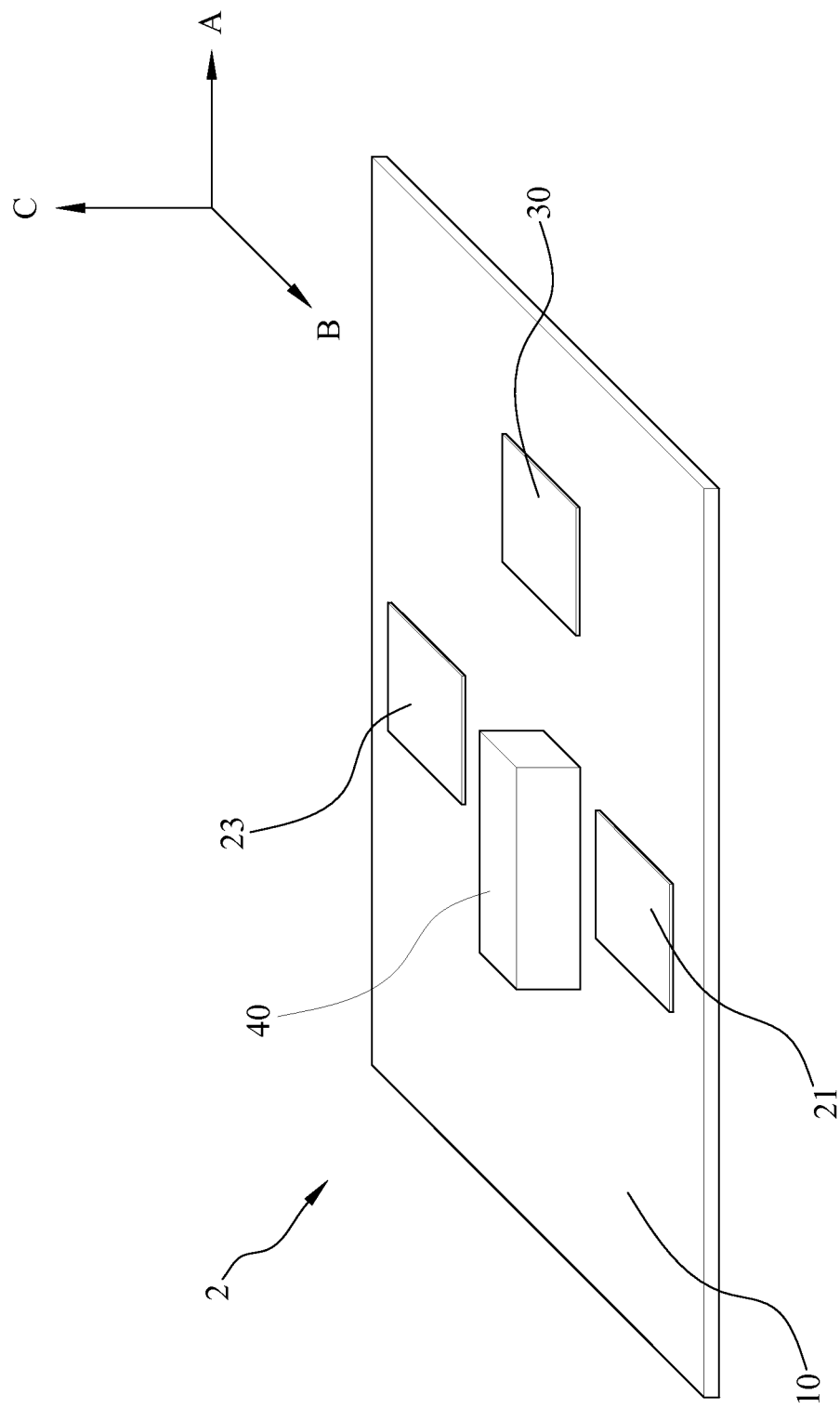
FIG. 1B is a perspective view showing the second embodiment of the planarized 3D magnetic sensor chip of the present invention.

FIG. 1B is the perspective view showing the second embodiment of the planarized 3D magnetic sensor chip of the present invention. As shown in FIG. 1B, the planarized 3D magnetic sensor chip 2 according to the second embodiment is similar to the planarized 3D magnetic sensor chip 1 according to the first embodiment. The difference between the two lies in that, the directions of the first magnetic sensing device 21 and the second magnetic sensing device 23 are changed, so as to measure the magnetic magnitude in the second direction B. The magnetic flux magnitude in the first direction A is then measured by the third magnetic sensor 30. The magnetic bending concentrating structure 40 is disposed between the first magnetic sensing device 21 and the second magnetic sensing device 23 to bend the magnetic flux magnitude in the third direction C to the second direction B, so the magnetic flux magnitude in the third direction C can be measured by the first magnetic sensing device 21 and the second magnetic sensing device 23.

Figure 1C:
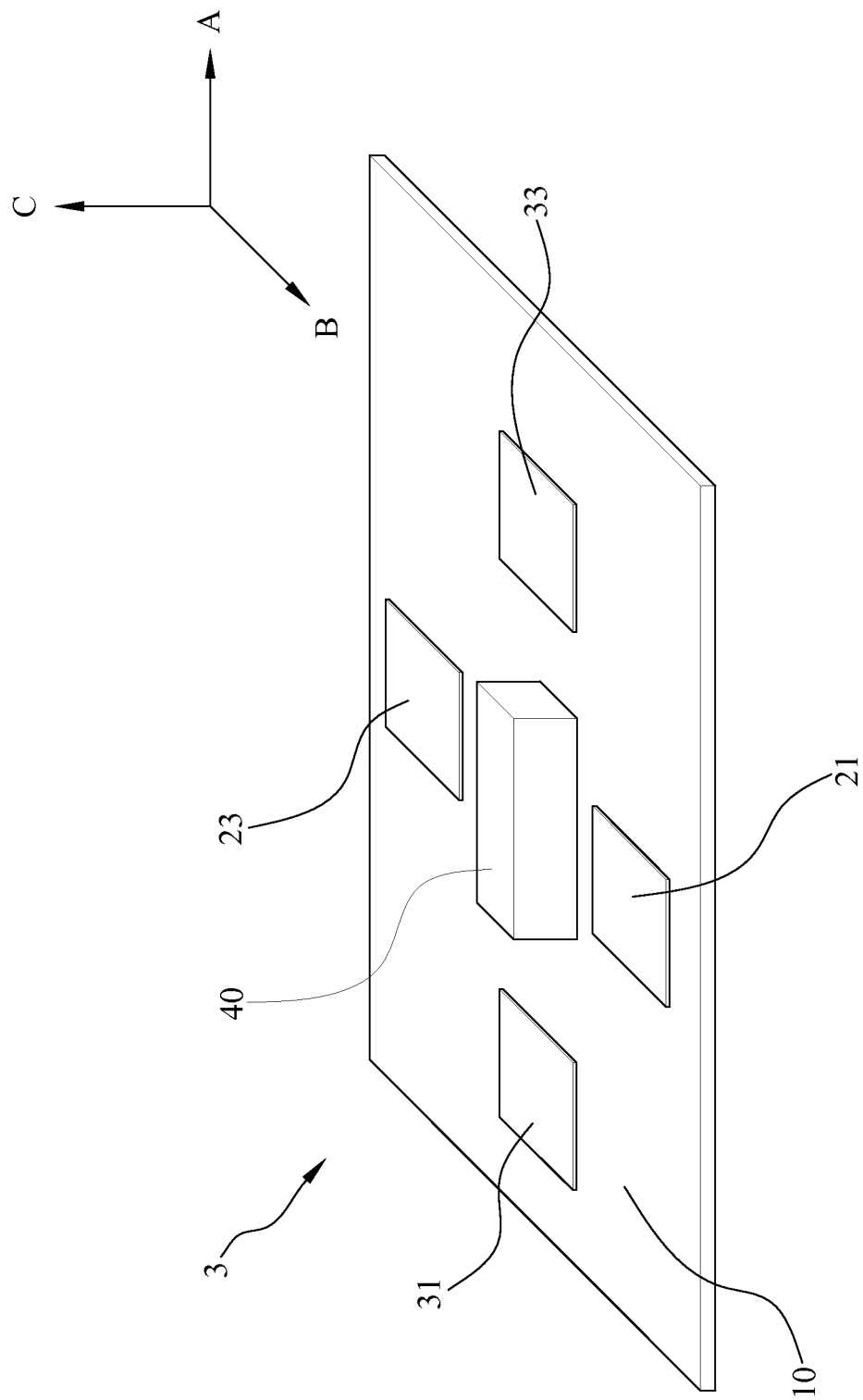
FIG. 1C is a perspective view showing the third embodiment of the planarized 3D magnetic sensor chip of the present invention.

FIG. 1C is the perspective view showing the third embodiment of the planarized 3D magnetic sensor chip of the present invention. As shown in FIG. 1C, the planarized 3D magnetic sensor chip 3 according to the third embodiment is an improvement of the planarized 3D magnetic sensor chip 1 according to the first embodiment, where the third magnetic sensing device 30 is replaced by the fourth magnetic sensing device 31 and the fifth magnetic sensing device 33. The first magnetic sensing device 21, the second magnetic sensing device 23, the fourth magnetic sensing device 31, the fifth magnetic sensing device 33 and the magnetic bending concentrating structure 40 are disposed on a top surface of the circuit chip substrate 10, and are electrically connected with a circuit (not shown) in the circuit chip substrate 10. The first magnetic sensing device 21 and the second magnetic sensing device 23 are utilized to measure the magnetic flux magnitude in the first direction A, and the fourth magnetic sensing device 31 and the fifth magnetic sensing device 33 are utilized to measure the magnetic flux magnitude in the second direction B. The magnetic bending concentrating structure 40 is disposed between the first magnetic sensing device 21 and the second magnetic sensing device 23, and is also disposed between the fourth magnetic sensing device 31 and the fifth magnetic sensing device 33. The magnetic flux magnitude in the third direction C is bend to the first direction A or the second direction B, so the first magnetic sensing device 21 and the second magnetic sensing device 23, or the fourth magnetic sensing device 31 and the fifth magnetic sensing device 33 can measure the magnetic flux magnitude in the third direction C.

Figure 2A:
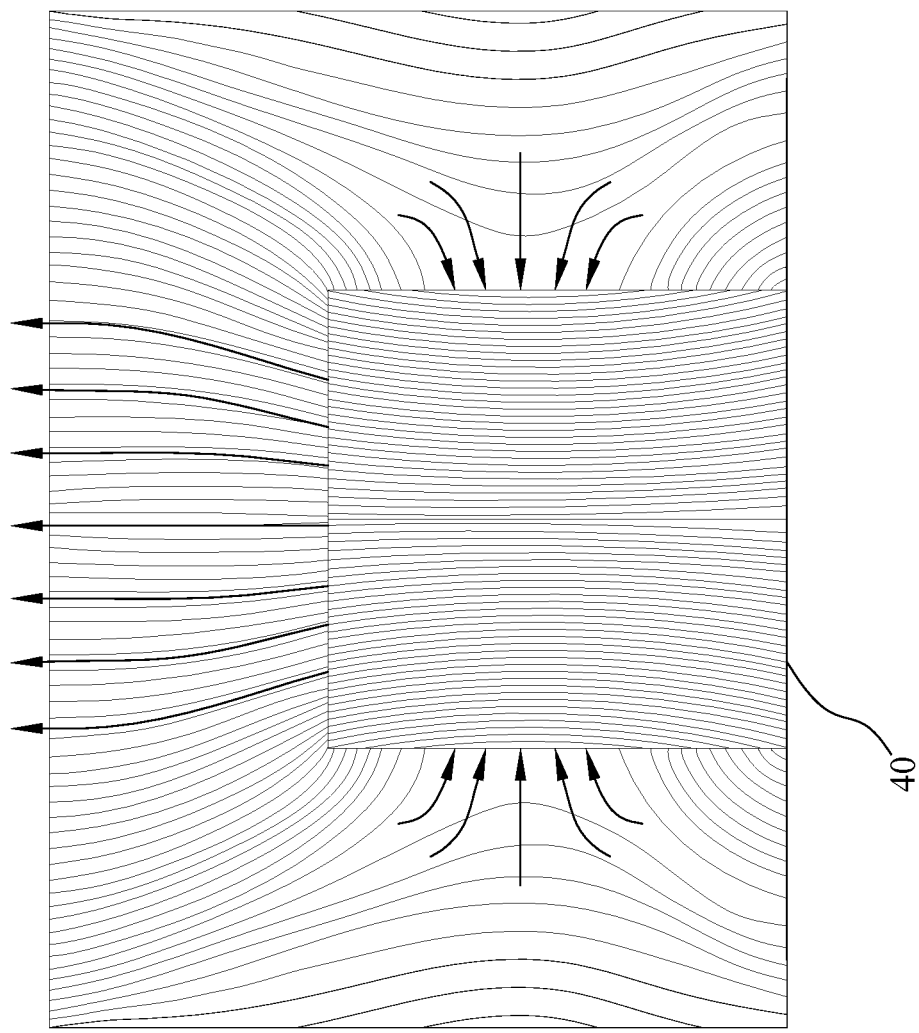
FIG. 2A is a schematic view showing the distribution of the magnetic field line of the magnetic bending concentrating structure employed in the 3D magnetic sensor chip of the present invention.
Figure 2B:
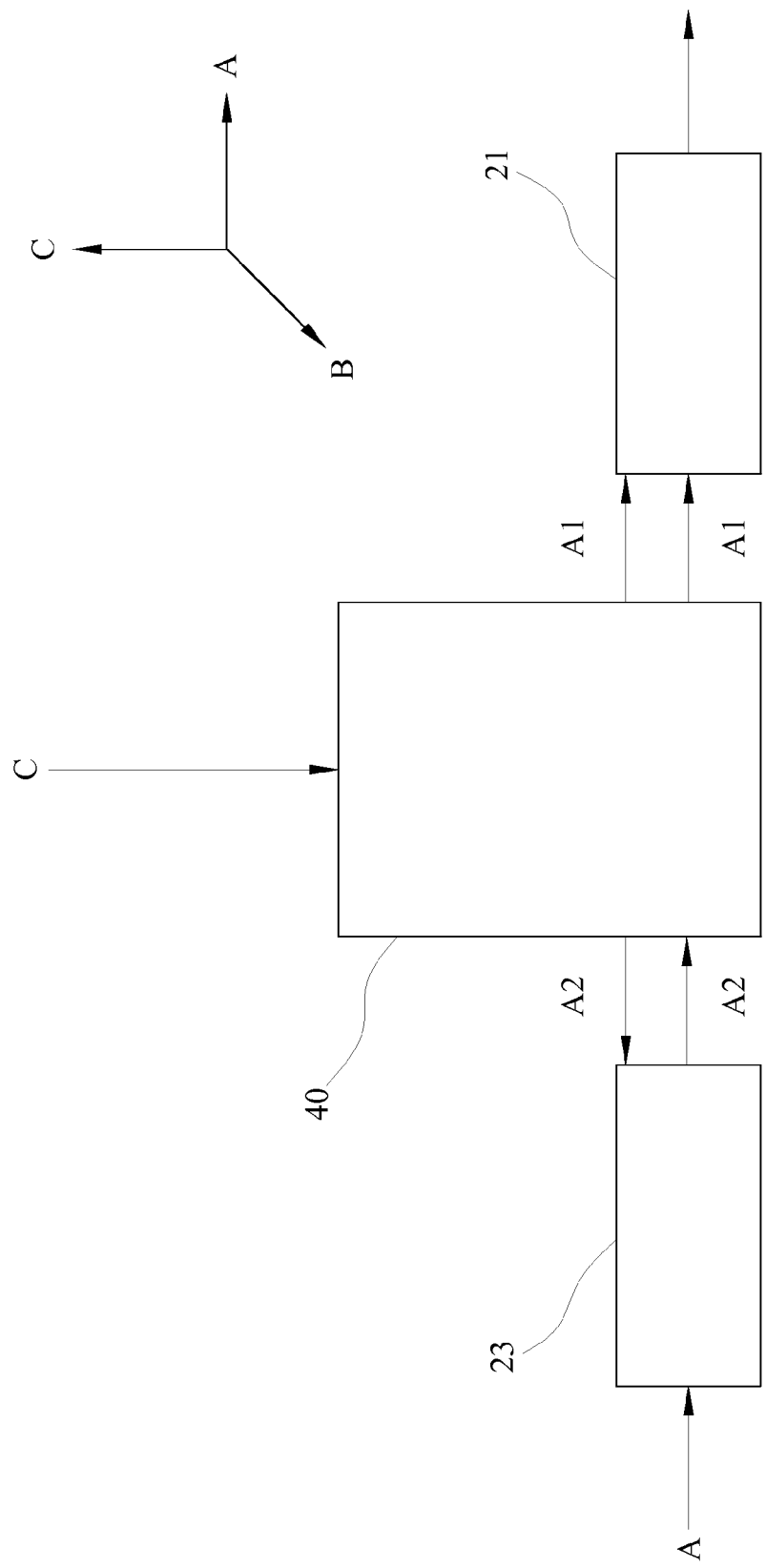
FIG. 2B is a simple schematic view showing the magnetic vectors of the magnetic bending concentrating structure employed in the 3D magnetic sensor chip of the present invention.

FIG. 2A and FIG. 2B are the schematic view showing the distribution of magnetic field lines and the simple magnetic vectors respectively. As shown in FIG. 2A, the magnetic bending concentrating structure 40 concentrates the magnetic field lines, which entered from above inside thereof, and then outputs the magnetic field lines beneath the magnetic bending concentrating structure 40 in two directions. As shown in FIG. 2B, the first embodiment as mentioned above is set as an example. When the magnetic flux magnitude in the third direction C enters from the top of the magnetic bending concentrating structure 40, the magnetic flux magnitude in the third direction C is bent to the first direction A and is output toward the two sides, so the first magnetic sensing device 21 and the second magnetic sensing device 23 can measure the magnetic flux A1 and A2 respectively. Because the direction of the magnetic flux A1 and A2 are not the same, the magnetic flux in the third direction C is actually A1−A2 with respect to the right-hand side. When the first magnetic sensing device 21 and the second magnetic sensing device 23 are arranged in the same direction, and when the magnetic flux measured by the first and second magnetic sensing devices 21 and 23 are A1 and A2, the actual magnetic flux in the first direction A equals to A1+A2, and the actual magnetic flux in the third direction C equals to A1−A2. When the first and second magnetic sensing device 21 and 23 are arranged in the opposite direction, the actual magnetic flux in the first direction A equals to A1−A2, and the actual magnetic flux in the third direction C equals to A1+A2. In this way, the first magnetic sensing device 21 and the second magnetic sensing device 23 are utilized to measure the magnetic flux magnitude in the first direction A and the third direction C. Notably, the embodiment described above is only for illustrative purpose but to limit the modification and variation of the present invention. Operations in various axes can also be applied therein.

Understandably, when the first magnetic sensing device 21, the second magnetic sensing device 23, the fourth magnetic sensing device 31 and the fifth magnetic sensing device 33 are in use, and the first magnetic sensing device 21 and the second magnetic sensing device 23 are arranged in the same direction, the magnetic flux magnitude in the first or second direction can be the sum of the measured magnetic flux magnitudes, and the magnetic flux magnitude in the third direction can be the difference between the measured magnetic flux magnitudes. On the contrary, when the first magnetic sensing device 21 and the magnetic sensing device 23 are arranged in the opposite direction, the magnetic flux magnitude in the first or second direction can be the difference between the measured magnetic flux magnitudes, and the magnetic flux magnitude in the third direction can be the sum of the measured magnetic flux magnitudes. When the fourth magnetic sensing device 31 and the fifth magnetic sensing device 33 are arranged in the same direction, the magnetic flux magnitude in the second or the first direction can be the sum of the measured magnetic flux magnitudes; while the fourth magnetic sensing device 31 and the fifth magnetic sensing device 33 are arranged in the opposite direction, the magnetic flux magnitude in the first or second direction can be the difference between the measured magnetic flux magnitudes.

Similarly, when the first magnetic sensing device 21, the second magnetic sensing device 23, the fourth magnetic sensing device 31 and the fifth magnetic sensing device 33 are in use, and the first magnetic sensing device 21 and the second magnetic sensing device 23 are arranged in the same direction, the magnetic flux magnitude in the first or second direction can be the sum of the measured magnetic flux magnitudes; while the first magnetic sensing device 21 and the second magnetic sensing device 23 are arranged in the opposite direction, the magnetic flux magnitudes in the first or second direction can be the difference between the measured magnetic flux magnitudes. When the fourth magnetic sensing device 31 and the fifth magnetic sensing device are arranged in the same direction, the magnetic flux magnitudes in the first or second direction can be the sum of the measured magnetic flux magnitudes, and the magnetic flux magnitude in the third direction can be the difference between the measured magnetic flux magnitudes. On the contrary, when the fourth magnetic sensing device 31 and the fifth magnetic sensing device are arranged in the opposite direction, the magnetic flux magnitudes in the first or second direction can be the difference between the measured magnetic flux magnitudes, and the magnetic flux magnitude in the third direction can be the sum of the measured magnetic flux magnitudes.

The first magnetic sensing device 21 and the second magnetic sensing device 23, the third magnetic sensing device 30 (or, the fourth magnetic sensing device 31 and the fifth magnetic sensing device 33) can be at least one of a anisotropic magnetic resistance (AMR) element, a giant magnetic resistance (GMR) element, and a tunneling magnetic reluctance (TMR) element. Each magnetic sensing device forms a bridge configuration independently first and then are electrically connected to each other, or are connected in series. For example, the first magnetic sensing device 21 and the second magnetic sensing device 23 are connected to each other to form the bridge configuration first, and then are electrically connected to the third magnetic sensing device 30 which forms the independent bridge configuration, or are electrically connected to the fourth magnetic sensing device 31 and the fifth magnetic sensing device 33 which are connected to each other.

The first magnetic sensing device 21 and the second magnetic sensing device 23, the third magnetic sensing device 30 (or, the fourth magnetic sensing device 31 and the fifth magnetic sensing device 33) can be manufactured independently before they are assembled onto the circuit chip substrate 10. Alternatively, they can also be directly formed on the circuit chip substrate 10 via physical or chemical deposition and etching process.

A bottom surface of the magnetic flux bending concentrating structure 40 is on the same level with, slightly higher or slightly lower than the surface of the first magnetic sensing device 21, the second magnetic sensing device 23 and the third magnetic sensing device 30 (or, the fourth magnetic sensing device 31 and the fifth magnetic sensing device 33). The magnetic flux bending concentrating structure 40 has a columnar shape, and is one of a solid cylinder, a corner pillar or a polygon pillar with any ratio of width and height. The magnetic flux bending concentrating structure 40 is a metallic magnetic material or a ceramic magnetic material, and a permeability of the magnetic flux bending concentrating structure 40 is 1~10000 H/m. The metallic magnetic material is at least one selected from a group consisting of iron, cobalt, nickel, iron-cobalt alloy, cobalt-nickel alloy, iron-nickel alloy, iron-cobalt-nickel alloy and cobalt-iron-boron compounds. The ceramic magnetic material is ferrimagnets, and the crystal structure of the ceramic magnetic material is at least one of the spinel, anti-spinel and perovskite.

The magnetic flux bending concentrating structure 40 is prepared beforehand and then is cut to be placed at intended position on the circuit chip substrate 10, or, the magnetic flux bending concentrating structure 40 can be formed on the circuit chip substrate 10 directly via physical or chemical deposition and etching. For example, multiple columnar holes are etched on the circuit chip substrate 10 first, and then the columnar holes are filled up with physical or chemical deposition method.

The present invention is characterized in that the magnetic flux bending concentrating structure 40 can be manufactured together with the first magnetic sensing device 21, the second magnetic sensing device 23 and the third magnetic sensing device 30 (or, the fourth magnetic sensing device 31 and the fifth magnetic sensing device 33) that measures the magnetic flux magnitude in the first and second directions via semiconductor manufacturing method. By bending the magnetic flux, the magnetic flux magnitudes in three directions can be measured on a plane, thereby emitting the conventional magnetic sensors which requires the 2-steps manufacturing method to install a magnetic sensing device in the third direction. In this way, the production rate and the yield of the magnetic sensors can be greatly improved.

The preferred embodiment described above is disclosed for illustrative purpose but to limit the modifications and variations of the present invention. Thus, any modifications and variations made without departing from the spirit and scope of the invention should still be covered by the scope of this invention as disclosed in the accompanying claims.

What is claimed is:

1. A planarized three-dimensional (3D) magnetic sensor chip, comprising:
   a circuit chip substrate;
   a first magnetic sensing device disposed on a top surface of said circuit chip substrate;
   a second magnetic sensing device disposed on said top surface of said circuit chip substrate, wherein said second magnetic sensing device cooperatively measures the magnitude of a magnetic flux in a first direction and the magnitude of said magnetic flux in a third direction with said first magnetic sensing device;
   a third magnetic sensing device disposed on said top surface of said circuit chip substrate for measuring the magnitude of said magnetic flux in a second direction, wherein said second direction is vertical to said first direction with respect to a plane, and said third direction is vertical to said first and second directions; and
   a magnetic flux bending concentrating structure disposed on said top surface of said circuit chip substrate and disposed between said first magnetic sensing device and said second magnetic sensing device, wherein said magnetic flux bending concentrating structure concentrates and bends the magnitude of said magnetic flux in said third direction to said first direction, and also measures the magnitude of said magnetic flux in said third direction via said first and second magnetic sensing device in said first direction; wherein
   said first magnetic sensing device, said second magnetic sensing device, said third magnetic sensing device and said magnetic flux bending concentrating structure are electrically connected to a circuit in said circuit chip substrate, and said first magnetic sensing device and said second magnetic sensing device are arranged symmetrically about said magnetic flux bending concentrating structure; and wherein
   when said first and second magnetic sensing devices are arranged in a same direction, the magnitude of said magnetic flux in said first direction is equal to the sum of the magnitudes of magnetic flux measured by said first and second magnetic sensing devices, and the magnitude of said magnetic flux in said third direction is equal to the difference between the magnitudes of magnetic flux measured by said first and second magnetic sensing devices; and when said first and second magnetic sensing devices are arranged in opposite directions, the magnitude of said magnetic flux in said first direction is equal to the difference between the magnitudes of magnetic flux measured by said first and second magnetic sensing devices, and the magnitude of said magnetic flux in said third direction is equal to the sum of the magnitudes of magnetic flux measured by said first and second magnetic sensing devices.

2. The planarized 3D magnetic sensor chip as claimed in claim 1, wherein said magnetic flux bending concentrating structure has a columnar shape, and is one of a solid cylinder, a corner pillar or a polygon pillar.

3. The planarized 3D magnetic sensor chip as claimed in claim 1, wherein said magnetic flux bending concentrating structure comprises a metallic magnetic material or a ceramic magnetic material, and a permeability of said magnetic flux bending concentrating structure is 1~10000 H/m.

4. The planarized 3D magnetic sensor chip as claimed in claim 3, wherein said metallic magnetic material is at least one selected from a group consisting of iron, cobalt, nickel, iron-cobalt alloy, cobalt-nickel alloy, iron-nickel alloy, iron-cobalt-nickel alloy and cobalt-iron-boron compounds.

5. The planarized 3D magnetic sensor chip as claimed in claim 3, wherein said ceramic magnetic material is ferrimagnets, and a crystal structure of said ceramic magnetic material is at least one of the spinel, anti-spinel and perovskite.

6. The planarized 3D magnetic sensor chip as claimed in claim 1, wherein said first magnetic sensing device, said second magnetic sensing device, said third magnetic sensing device and said magnetic flux bending concentrating structure are arranged in a line, and said first or second magnetic sensing device is disposed between said third magnetic sending device and said magnetic flux bending concentrating structure.

7. The planarized 3D magnetic sensor chip as claimed in claim 1, wherein said first, second and third magnetic sensing devices are one of an anisotropic magnetic resistance (AMR) element, a giant magnetic resistance (GMR) element or a tunneling magnetic resistance (TMR) element, in which said first, second and third magnetic sensing devices form a bridge configuration independently and are electrically connected to each other, or said first and second magnetic sensing devices are connected to each other to form a bridge configuration first, and then is connected to an independent bridge configuration formed by said third magnetic sensing device.

8. The planarized 3D magnetic sensor chip as claimed in claim 1, wherein said first, second and third magnetic sensing devices are manufactured separately and independently before being assembled onto said circuit chip substrate.

9. The planarized 3D magnetic sensor chip as claimed in claim 1, wherein said first, second and third magnetic sensing devices are directly formed on said circuit chip substrate via physical or chemical deposition and etching process.

10. The planarized 3D magnetic sensor chip as claimed in claim 1, wherein a bottom surface of said magnetic flux bending concentrating structure is on the same level with, slightly higher or slightly lower than the surface of said first magnetic sensing device, said second magnetic sensing device and said third magnetic sensing device.

11. The planarized 3D magnetic sensor chip as claimed in claim 1, wherein said magnetic flux bending concentrating structure is prepared beforehand and then is cut and placed at an intended position.

12. The planarized 3D magnetic sensor chip as claimed in claim 1, wherein said magnetic flux bending concentrating structure is formed on said circuit chip substrate via physical or chemical deposition and etching process.

* * * * *